US00RE41457E

(19) United States
(12) Reissued Patent
Newman et al.

(10) Patent Number: US RE41,457 E
(45) Date of Reissued Patent: Jul. 27, 2010

(54) WAVEMETER FOR GAS DISCHARGE LASER

(75) Inventors: Peter C. Newman, San Diego, CA (US); John T. Melchior, San Diego, CA (US); Richard L. Sandstrom, Encinitas, CA (US)

(73) Assignee: Cymer, Inc., San Diego, CA (US)

(21) Appl. No.: 11/091,005

(22) Filed: Mar. 25, 2005

Related U.S. Patent Documents

Reissue of:
(64) Patent No.: 6,539,046
Issued: Mar. 25, 2003
Appl. No.: 09/473,852
Filed: Dec. 27, 1999

U.S. Applications:
(63) Continuation-in-part of application No. 09/273,446, filed on Mar. 19, 2009, now Pat. No. 6,018,537, which is a continuation-in-part of application No. 09/165,593, filed on Oct. 2, 1998, now Pat. No. 5,978,394.

(51) Int. Cl.
*H01S 3/13* (2006.01)
*H01S 3/08* (2006.01)

(52) U.S. Cl. ..... 372/98; 372/29.021; 372/30; 372/32; 372/101

(58) Field of Classification Search ..... 372/29.021, 372/30, 32, 98, 101
See application file for complete search history.

(56) References Cited

U.S. PATENT DOCUMENTS

| | | | | |
|---|---|---|---|---|
| 5,025,445 | A | 6/1991 | Anderson et al. | 372/20 |
| 5,243,614 | A | 9/1993 | Wakata et al. | 372/29 |
| 5,621,523 | A | 4/1997 | Oobayashi et al. | 356/336 |
| 5,864,574 | A | 1/1999 | Welch et al. | 372/50 |
| 5,978,394 | A | 11/1999 | Newman et al. | 372/32 |
| 5,991,324 | A | 11/1999 | Knowles et al. | 372/57 |
| 6,040,552 | A | 3/2000 | Jain et al. | 219/121.7 |

FOREIGN PATENT DOCUMENTS

| | | |
|---|---|---|
| DE | 4139032 | 6/1992 |
| JP | 05067821 | 3/1993 |

*Primary Examiner*—Armando Rodriguez

(57) ABSTRACT

An optical configuration to illuminate an etalon in a laser wavemeter with a minimum level of light intensity. The system includes optical components to direct a portion of the laser output beam representing the entire cross section of the beam, through an etalon positioned in an etalon housing and onto a photodetector. A first lens condenses the size of the beam sample, and a second lens re-collimates the beam which then passes into the etalon housing, ensuring that all of the spatial components of the beam are adequately sampled. A diffractive diffusing element is incorporated into the optical path. In a preferred embodiment, the diffractive diffusing element is placed within the etalon housing between said plano-concave lens and the etalon. In another preferred embodiment, the diffusing element is located up stream but outside the housing in the optical path.

11 Claims, 5 Drawing Sheets

WAVEMETER FOR GAS DISCHARGE LASER

Matter enclosed in heavy brackets [ ] appears in the original patent but forms no part of this reissue specification; matter printed in italics indicates the additions made by reissue.

This is a continuation-in-part Ser. No. 09/273,446 filed Mar. 19, 1999 (now U.S. Pat. No. 6,018,537) which is a continuation-in-part of Ser. No. 09/165,593 filed Oct. 2, 1998 (U.S. Pat. No. 5,978,394). This invention relates to lasers and, in particular, to a technique for accurately measuring the output wavelength of a gas discharge laser.

FIELD OF THE INVENTION

BACKGROUND OF THE INVENTION

Discharge lasers, especially excimer lasers, are being increasingly used in the photo lithographic manufacture of semiconductor devices. As projection lens technology has advanced, the requirements on the control of the laser light output have increased. For example, variations in the output power, central wavelength and wavelength spectrum of a laser source must be minimized to ensure consistent process performance. To achieve this control, the output wavelength of the laser must be well characterized, and remain stable and precisely controlled over a wide range of operating conditions.

Precise measurements of laser wavelength are needed to effect precise control. A typical technique for wavelength measurement directs a portion of the laser beam through an etalon to create an optical fringe pattern, where the spacing of the fringe pattern can be related to wavelength. This fringe spacing can be detected with a sensor such as a multi-element photo diode array, and the resulting measurements can be used for a wavelength feedback control system.

An etalon is an optical device consisting of two flat surfaces, held parallel to high precision, typically to within a small fraction of the laser wavelength. These surfaces could be opposite sides of a transparent optical element, which is referred to as a "solid to etalon". In another type of construction, the etalon could be formed by the adjacent surfaces of two transparent optical elements, separated by a spacer or spacers with parallel faces. This assembly is often referred to as an "air-spaced etalon", although the gap between the two elements could be filled with any transparent fluid.

Special coatings can be applied to the surfaces of the etalon to enhance their reflectivity at a particular wavelength, or range of wavelengths. This creates an optical cavity, in which constructive and destructive interference of light passing through the cavity can occur. The nature of this interference will depend, among other factors, upon the wavelength, spectrum, and direction of the light, the flatness, parallelism and reflectivity of the optical surfaces, and the optical path length between the two cavity surfaces. If some number of these factors can be held constant, the nature of the interference pattern produced can be measured to provide information about the other factors.

In laser wavelength measurement systems (such systems are hereafter called wavemeters), an optical module samples a laser output beam, and directs the sampled light through a suitably positioned etalon. Since spatial variations of spectral characteristics may exist in any given laser beam, the wavemeter should equally sample all portions of the beam to determine the wave characteristic of the beam. Such a wavemeter system might also provide optical components to form an image of the resulting interference pattern, a detector to record the pattern, and electronics suitable for analyzing the pattern to measure the wavelength. Such a wavemeter was described by two of the present inventors in U.S. patent application Ser. No. 09/165,593 (now U.S. Pat. No. 5,978,394) assigned to the present assignee and incorporated herein by reference.

The resulting measurement of wavelength remains extremely sensitive to small changes in the optical path length in the etalon cavity. In the case of an air-spaced etalon, this path length is affected by the spacing of the cavity surfaces, and the index of refraction of the fluid between them, both of which may be affected by temperature changes. The cavity spacing can be controlled in a number of ways, for example, by constructing the spacers from a material known to have high dimensional stability and a low and well-characterized coefficient of thermal expansion. The index of refraction of the cavity fluid is sensitive to the temperature and pressure. Often the etalon is contained in a sealed enclosure. This enclosure would necessarily include suitable windows.

The temperature or pressure of the etalon structure and the surrounding fluid can be monitored to establish the relationship between the temperature and the wavelength measurements. A compensation factor could be applied to correct the wavelength measurements for the measured temperature. However, a temperature or pressure monitor may not detect rapidly occurring thermal variations.

What is needed is a better method for illuminating an etalon in a wavemeter so as to minimize calibration variations over a wide range of laser operating conditions.

SUMMARY OF THE INVENTION

The present invention provides an optical configuration to illuminate an etalon in a laser wavemeter with a minimum level of light intensity. The system includes optical components to direct a portion of the laser output beam representing the entire cross section of the beam, through an etalon positioned in an etalon housing and onto a photodetector. A first lens condenses the size of the beam sample, and a second lens re-collimates the beam which then passes into the etalon housing, ensuring that all of the spatial components of the beam are adequately sampled. A diffractive diffusing element is incorporated into the optical path. In a preferred embodiment, the diffractive diffusing element is placed within the etalon housing between said plano-concave lens and the etalon. In another preferred embodiment, the diffusing element is located up stream but outside the housing in the optical path.

DETAILED DESCRIPTION OF PREFERRED EMBODIMENTS

Narrowband Spectrum

Gas discharge lasers may be narrowbanded, using well known prior art techniques. The FWHM bandwidth may be greatly reduced (by a factor of almost 800) to about 0.6 pm, and the pulse energy is reduced (by only a factor of about 5) to about 5 mJ. As a result, the intensity of the pulse at the desired narrow band is very greatly increased. Typically the pulse energy of a narrowband lithography laser is about 5 to 10 mJ.

Figure 4:
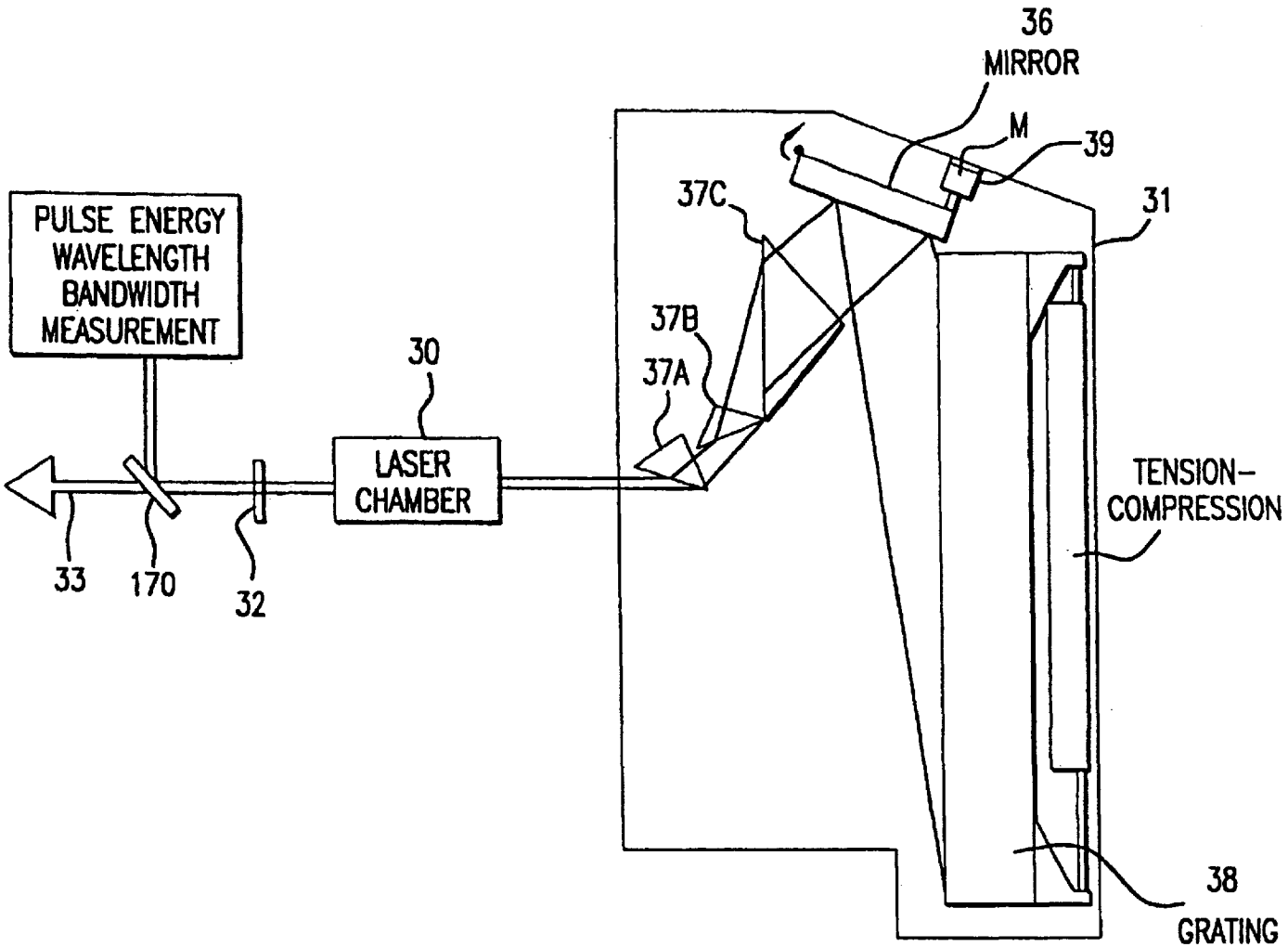
FIG. 4 is a block diagram showing principal features for controlling wavelength of an excimer laser.

As shown in FIG. 4, the laser 30 may be tuned to operate at any wavelength within the laser's broadband spectrum using tuning mirror 36 in line-narrowing module 31. Preferably the tuning range for ArF lithography is considered to be from about 193,300 pm to 193,400 pm. In a preferred embodiment, the laser is tuned by pivoting mirror 36 with stepper motor 39 so as to slightly change the angle at which the laser beam (expanded by prisms 37A, 37B and 37C) is incident on grating 38.

Measuring Beam Parameters

Figure 1:
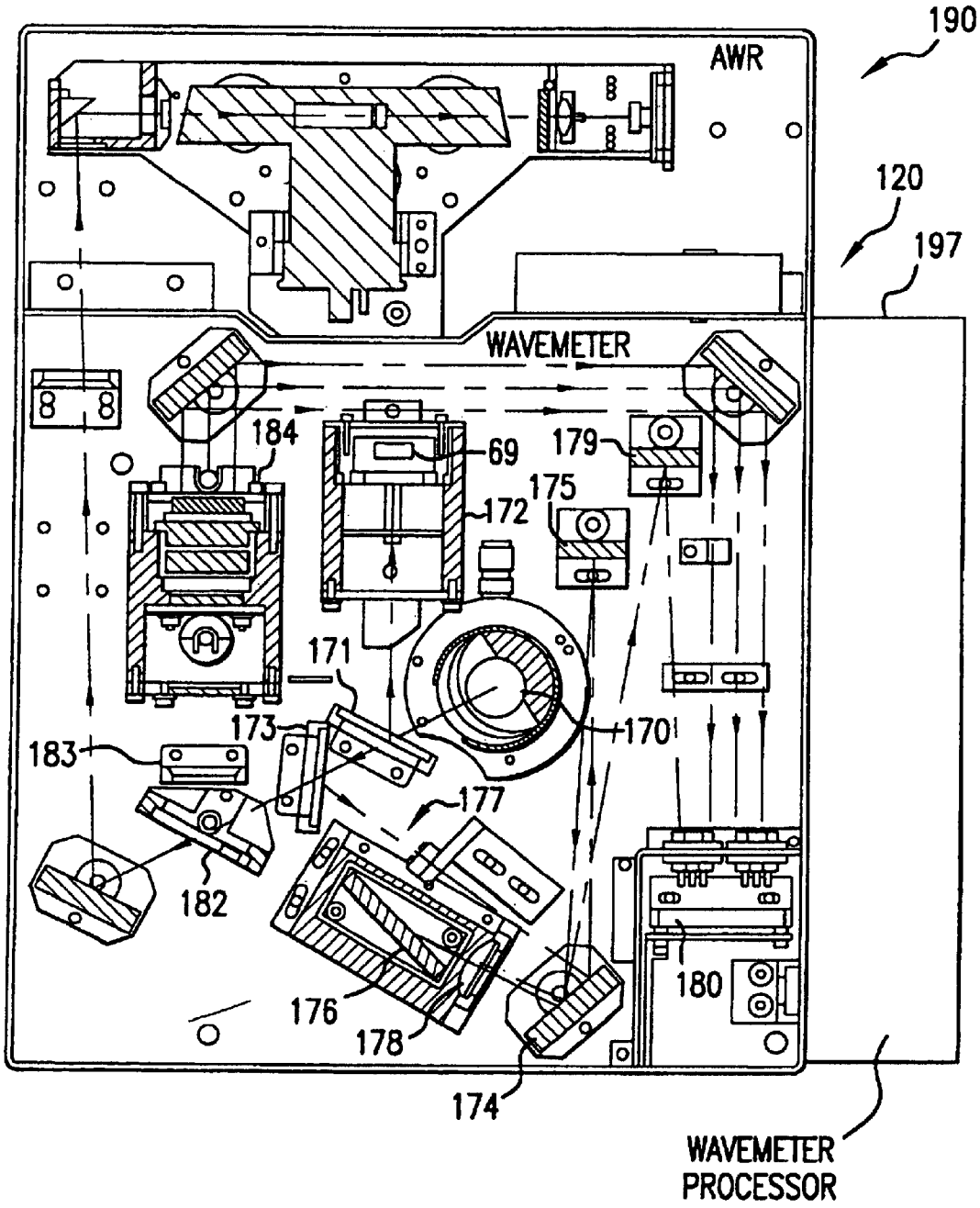
FIG. 1 shows the principal elements of a wave meter.

FIG. 1 shows the layouts of a preferred wavemeter unit 120 an absolute wavelength reference calibration unit 190, and a wavemeter processor 197.

The optical equipment in these units measure pulse energy, wavelength and bandwidth. These measurements are used with feedback circuits to maintain pulse energy and wavelength within desired limits. The equipment calibrates itself by reference to an atomic reference source on the command from the laser system control processor.

As shown in FIG. 1, the output beam from output coupler 32 (as shown in FIG. 4) intersects partially reflecting mirror 170, which passes about 95.5% of the beam energy as output beam 33 and reflects about 4.5% for pulse energy, wavelength and bandwidth measurement.

Pulse Energy

About 4% of the reflected beam is reflected by mirror 171 to energy detector 172 which comprises a very fast photo diode 69 which is able to measure the energy of individual pulses which may be occurring at the rate of 1000 per second. The pulse energy is about 5 mJ, and the output of detector 69 is fed to a computer controller which uses a special algorithm to adjust the laser charging voltage to precisely control the pulse energy of future pulses based on stored pulse energy data in order to limit the variation of the energy of individual pulses and the integrated energy of series of pulses or bursts of pulses.

Coarse Wavelength Measurement

About 4% of the beam which passes through mirror 171 is reflected by mirror 173 through slit 177 to mirror 174, to mirror 175, back to mirror 174 and onto echelle grating 176. The beam is collimated by lens 178 having a focal length of 458.4 mm. Light reflected from grating 176 passes back through lens 178, is reflected again from mirrors 174, and then is reflected from mirror 179 and focused onto the left side of 1024-pixel linear photo diode array 180. The spatial position of the beam on the photo diode array is a coarse measure of the relative nominal wavelength of the output beam.

Linear Photo Diode Array

Linear Photo diode array 180 is an integrated circuit chip comprising 1024 separate photo diode integrated circuits and an associated sample and hold readout circuit. The photo diodes are on a 25 micrometer pitch for a total length of 25.6 mm (about one inch). Each photo diode is 500 micrometer long. Photo diode arrays such as this are available from several sources. A preferred supplier is Hamamatsu. In our preferred embodiment, we use a Model S3903-1024 which can be read at the rate of $2\times10^6$ pixels/sec on a FIFO basis in which complete 1024 pixel scans can be read at rates of 2000 Hz or greater.

Calculation of Coarse Wavelength

The coarse wavelength optics in wavemeter module 120 produces a rectangular image of about 0.25 mm×3 mm on the left side of photo diode array 180. The ten or eleven illuminated photo diodes will generate signals in proportion to the intensity of the illumination received and the signals are read and digitized by a processor in wavemeter controller 197. Using this information and an interpolation algorithm controller 197 calculates the center position of the image.

This position (measured in pixels) is converted into a coarse wavelength value using two calibration coefficients and assuming a linear relationship between position and wavelength. These calibration coefficients are determined by reference to an atomic wavelength reference source. For example, the relationship between image position and wavelength might be the following algorithm:

$$\lambda=(2.3\text{ pm/pixel})P+191{,}625\text{ pm}$$

where P=coarse image central positions.

Fine Wavelength Measurement

About 95% of the beam which passes through mirror 173 as shown in FIG. 1 is reflected off mirror 182 through lens 183 onto a diffuser at the input to etalon assembly 184. The beam exiting etalon 184 is focused by a 458.4 mm focal length lens in the etalon assembly and produces interference fringes on the middle and right side of linear photo diode array 180 after being reflected off two mirrors as shown in FIG. 1.

The spectrometer must measure wavelength and bandwidth substantially in real time. Because the laser repetition rate may be 1000 $H_Z$ or higher, it is necessary to use algorithms which are accurate but not computationally intensive in order to achieve the desired performance with economical and compact processing electronics. Calculational algorithm therefore preferably should use integer as opposed to floating point math, and mathematical operations should preferably be computation efficient (no use of square root, sine, log, etc.).

Improved Etalon

Conventional etalon mounting schemes typically employ an elastomer to mount the optical elements to the surrounding structure, to constrain the position of the elements but minimize forces applied to the elements. A compound commonly used for this is room-temperature vulcanizing silicone (RTV). However, various organic vapors emitted from these elastomers can deposit onto the optical surfaces, degrading their performance. In order to prolong etalon performance lifetime, it is desirable to mount the etalon in a sealed enclosure that does not contain any elastomer compounds.

Figure 2A:
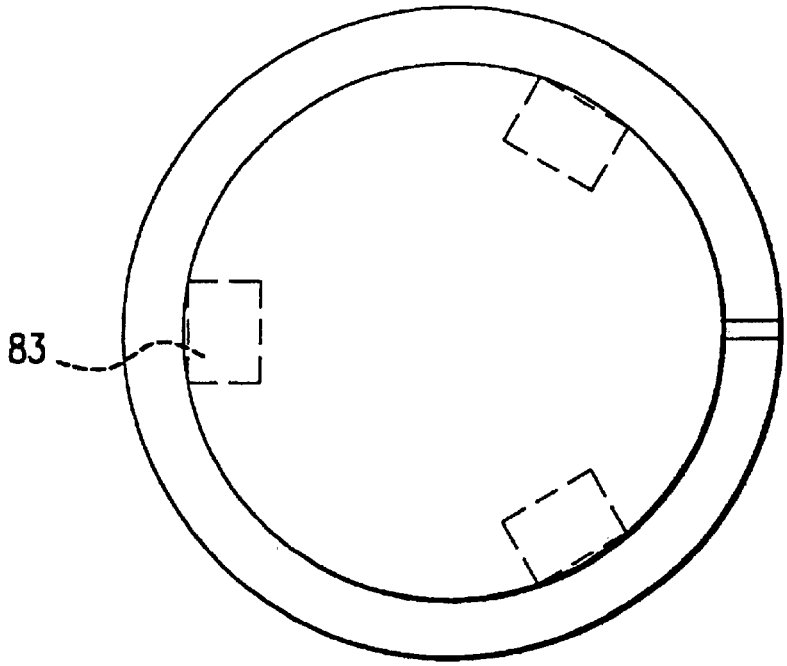
FIGS. 2A and 2B show views of an etalon.
Figure 2B:
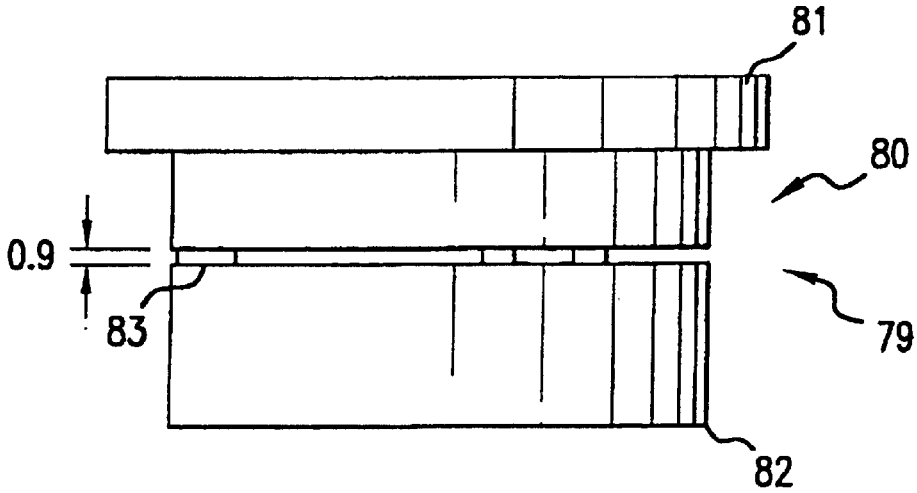
Figure 3:
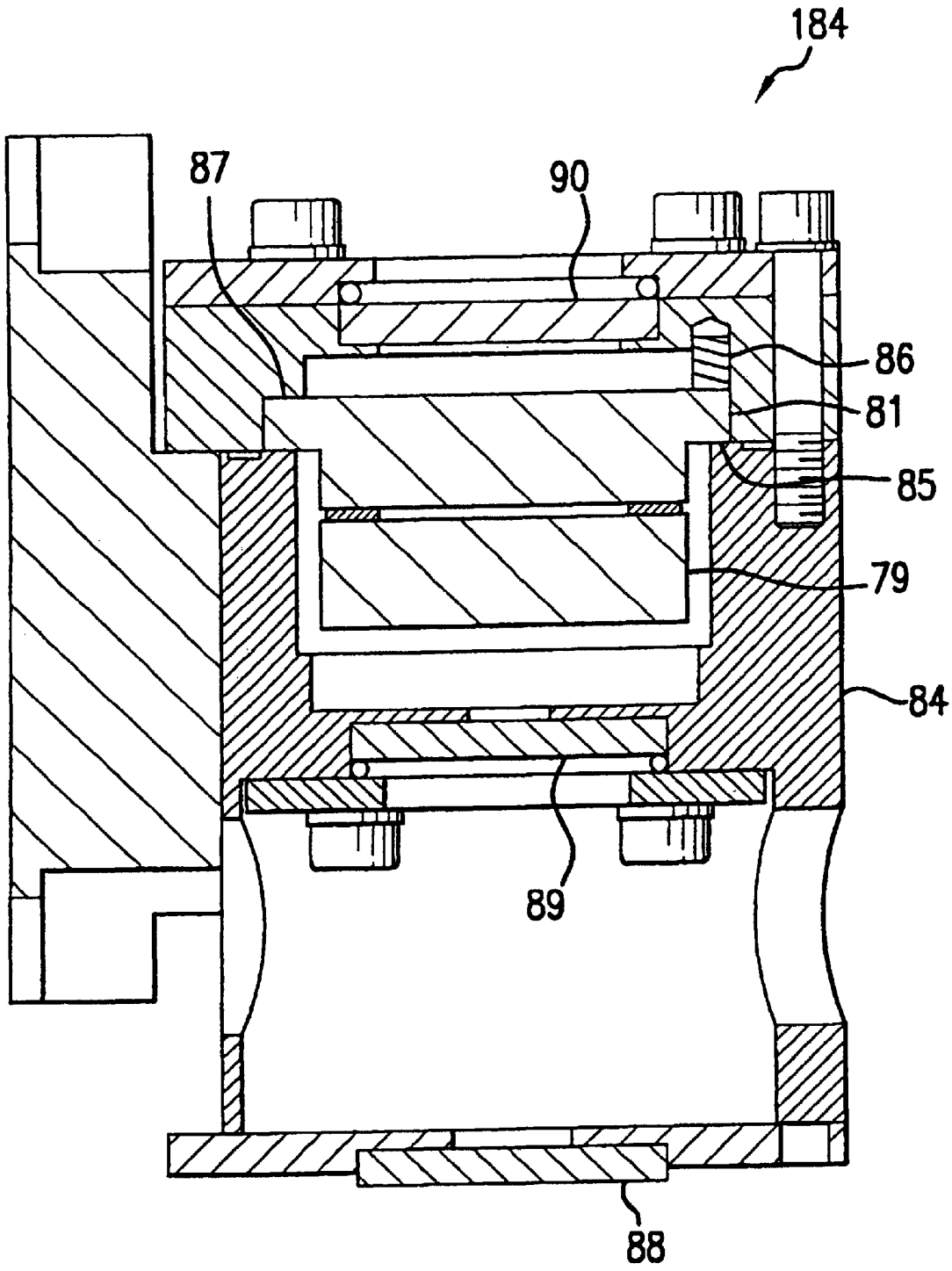
FIG. 3 shows an etalon assembly including an etalon housing.

A preferred embodiment includes an improved etalon assembly shown at 184 in FIG. 1. This etalon assembly is shown in detail in FIGS. 3, 2A and 2B. The fused silica etalon 79 itself is comprised of a top plate 80 having a flange 81 and a lower plate 82, both plates being comprised of premium grade fused silica. The etalon is designed to produce fringes having free spectral range of 20.00 pm at 193.35 nm when surrounded by gas with an index of refraction of 1.0003 and a finesse equal to or greater than 25. Three fused silica spacers 83 with ultra low thermal expansion separate the plates and are 934 micrometer ±1 micrometer thick. These hold the etalon together by optical contact using a technique well known in the optics manufacturing art. The reflectance of the inside surfaces of the etalon are each about 88 percent and the outside surfaces are anti-reflection coated. The transmission of the etalon is about 50 percent.

The etalon 79 is held in place in aluminum housing 84 only by gravity and three low force springs 86 pressing the flange against three pads not shown but positioned on 120 degree centers under the bottom edge of flange 81 at the radial location indicated by leader 85. A clearance of only 0.004 inch along the top edge of flange 81 at 87 assures that the etalon will remain approximately in its proper position. This close tolerance fit also ensures that if any shock or impulse is transferred to the etalon system through the mounting, the relative velocities between the optical components and the housing contact points will be kept to a minimum. Other optical components of etalon assembly 184 include diffuser 88, window 89 and focusing lens 90 having a focal length of 458.4 mm.

The diffuser 88 may be a standard prior art diffuser commonly used up-stream of an etalon to produce a great variety of incident angles needed for the proper operation of the etalon. A problem with prior art diffusers is that about 90 percent of the light passing through the diffuser is not at a useful angle and consequently is not focused on the photo diode array. This wasted light, however, adds to the heating of the optical system and can contribute to degradation of optical surfaces. In a much preferred embodiment, a diffractive lens array is used as the diffuser 88. With this type of diffuser, a pattern is produced in the diffractive lens array which scatters the light thoroughly but only within an angle of about 5 degrees. The result is that about 90 percent of the light falling on the etalon is incident at useful angles and a much greater portion of the light incident on the etalon is ultimately detected by the photo diode array. The result is the light incident on the etalon can be greatly reduced which greatly increases optical component life. Applicants estimate that the incident light can be reduced to less than 5% or 10% of prior art values with equivalent light on the photo diode array.

Better Collimation

Figure 5:
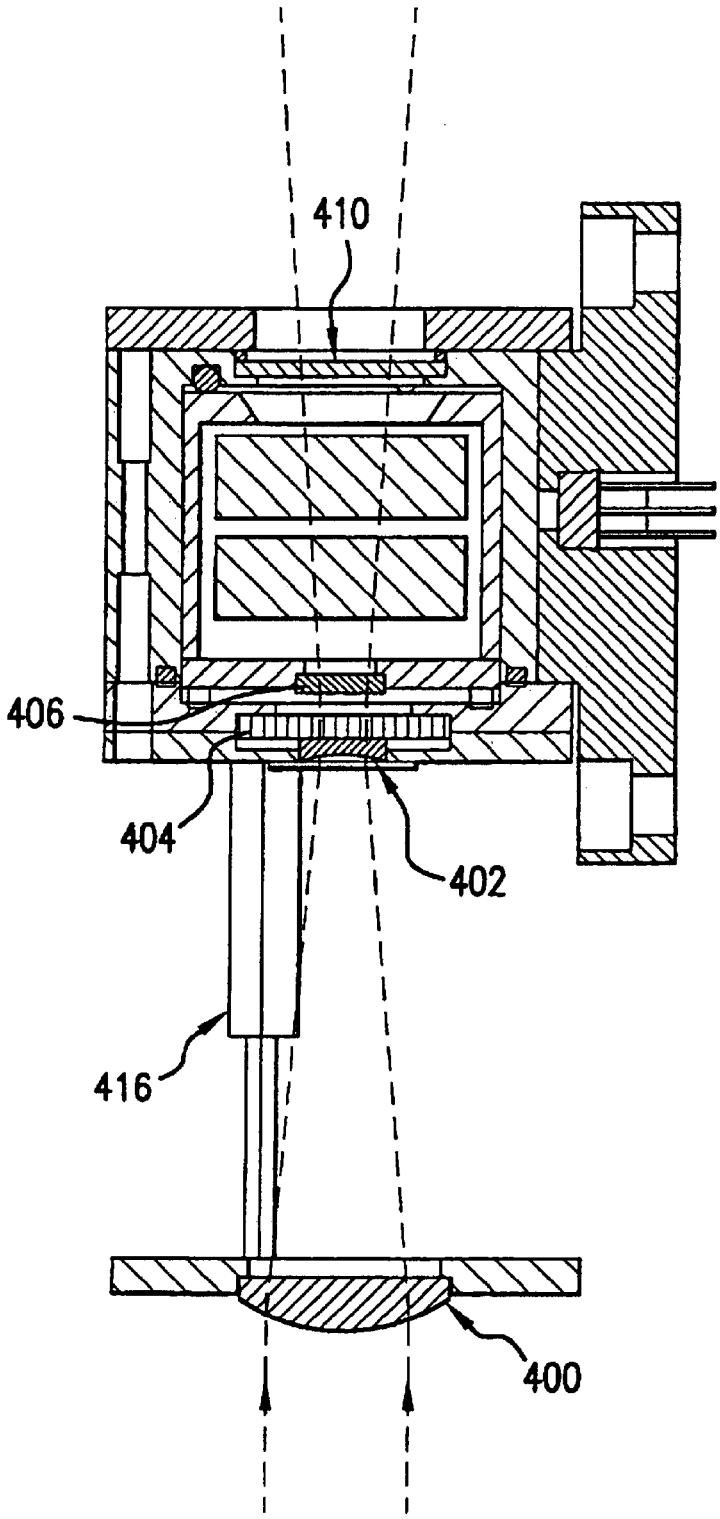
FIG. 5 shows the features of a preferred etalon assembly.

FIG. 5 shows features of a preferred embodiment providing even further reduction of light intensity passing through the etalon. This embodiment is similar to the embodiment shown in FIGS. 1, 2A, 2B and 3. The sample beam from mirror 182 (approximately 15 mm×3 mm) passes upward through condensing lens 400 and is then re-collimated by lens 402. The beam now colliminated and reduced in dimension to about 5 mm×1 mm passes through etalon housing window 404 and then passes through a diffractive diffusing element 406 which in this case (for an ArF laser) is a diffractive diffusing element provided by Mems Optical Corporation. The element is part number D023-193 which converts substantially all 193 nm light in any incoming collimated beam of any cross sectional configuration into a beam expanding in a first direction at 2° and in a second direction perpendicular to the first direction at 4°. Lens 410 then "focuses" the expanding beam onto a rectangular pattern covering photodiode array 180 shown in FIG. 1. The active area of the photo diode array is about 0.5 mm wide and 25.6 mm long and the spot pattern formed by lens 410 is about 15 mm×30 mm. Diffractive diffusing element thoroughly mixes the spacial components of the beam but maintains substantially all of the beam energy within the 2° and 4° limits so that the light passing through the etalon can be substantially reduced and efficiently utilized. The reader should recognize that further reductions in beam energy passing through the etalon could be realized by reducing the spot pattern in the short dimension of the photo diode array. However, further reductions to less than 15 mm will make optical alignment more difficult. Therefore, the designer should consider the spot pattern size to be a trade-off issue.

In another system designed for a KrF laser operating at about 248.327 nm a similar design is provided with adjustments for wavelength. In this embodiment lens 400 has a focal length of about 50 mm. (The lens is Melles Griot Corporation part number OILQP001.) Collimating lens 402 has a focal length of −20 mm (EVI Laser Corporation part number PLCC-10.0-10.3-UV). The diffractive diffusing element 406 is Mems Optical Corporation part number DO23-248. In this embodiment and in the ArF embodiment, the spacing between the two lenses can be properly positioned with spacer 416. Applicants estimate that the energy of the beam passing through the etalon with the laser operating at 2000 Hz is about 10 mw and is not sufficient to cause significant thermal problems in the etalon.

In other preferred embodiments, the beam could be allowed to come to a focus between lenses 400 and 402. Appropriate lenses would in this case be chosen using well known optical techniques.

While particular embodiments of the present invention have been shown and described, it will be obvious to those skilled in the art that changes and modifications may be made without departing from this invention in its broader aspects. For example, other diffractive diffusing elements are available with expansion angles wider or narrower than the 2° and 4° angles referred to above. Preferably, however, expansion angles should be less than 10°.

What is claimed is:

1. A wavemeter for measuring wave properties of a laser beam of a gas discharge laser, said wavemeter comprising:

A) a first optical train, comprising at least two optical elements, for converting a portion of said laser beam into a substantially collimated sample beam spatially representative of the laser beam;

B) a diffractive diffusing element configured to diffuse said sample beam into a diffused beam which is expanding at angles of less than 10 degrees;

C) an etalon system positioned in said diffused beam, said etalon system comprising:

1) an etalon housing, *and*

[2) two windows permitting light to enter said housing, and]

[3] *2*) an etalon positioned within said housing;

D) a detector array; and

E) a second optical train, comprising at least one focusing optical element, for focusing a beam exiting said etalon system onto said detector array;

wherein said etalon produces interference fringe patterns on said detector array, said fringe patterns being indicative of wavelength and bandwidth of said laser beam of said gas discharge laser.

2. A wavemeter as in claim 1 wherein said diffractive diffusing element is a diffractive lens array.

3. A wavemeter as in claim 2 wherein said diffractive lens array is configured to scatter light within an angle of about 5 degrees.

4. A wavemeter as in claim 3 wherein said lens is configured to scatter light within an angle of about 2 degrees in a first dimension and about 4 degrees in a second dimension.

5. A wavemeter as in claim 1 wherein said first optical train comprises condensing lens and a recollimating lens for cross section reduction of the sample beam.

6. A wavemeter as in claim 1 wherein said etalon comprises an upper plate and a lower plate and three fused silica spacers separating said upper and plate.

7. A wavemeter as in claim 6 wherein said spacers are about 934 micrometer±1 micrometers thick.

8. A wavemeter as in claim 6 wherein said upper plate comprises a support flange for supporting said upper and lower plates.

9. A wavemeter as in claim 8 wherein said upper and lower plates and said spaces are held together by optical contact.

10. A wavemeter as in claim 1 wherein said diffractive diffusing element is configured to diffuse said sample beam into a beam substantially all of which is diverging at angles of less than 2 degrees in a first direction and diverging at angles of less than 4 degrees in a second direction perpendicular to said first direction.

11. A wavemeter as in claim 1 wherein said at least two optical elements in said first beam train are two lenses.

* * * * *